United States Patent
Iwamatsu et al.

(10) Patent No.: US 7,291,542 B2
(45) Date of Patent: Nov. 6, 2007

(54) SEMICONDUCTOR WAFER AND MANUFACTURING METHOD THEREOF

(75) Inventors: Toshiaki Iwamatsu, Tokyo (JP); Shigenobu Maeda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 121 days.

(21) Appl. No.: 11/223,970

(22) Filed: Sep. 13, 2005

(65) Prior Publication Data

US 2006/0006423 A1    Jan. 12, 2006

Related U.S. Application Data

(62) Division of application No. 10/461,352, filed on Jun. 16, 2003, now abandoned.

(30) Foreign Application Priority Data

Sep. 30, 2002   (JP) .............................. 2002-285160

(51) Int. Cl.
*H01L 21/30* (2006.01)
*H01L 21/46* (2006.01)
(52) U.S. Cl. .................. 438/455; 438/459; 257/21.482
(58) Field of Classification Search ................ 438/455, 438/456, 457, 458, 459
See application file for complete search history.

(56) References Cited

U.S. PATENT DOCUMENTS

| 3,920,492 A | 11/1975 | Sugita et al. |
| 5,060,043 A | 10/1991 | Yasue |
| 5,227,339 A | 7/1993 | Kishii |

(Continued)

FOREIGN PATENT DOCUMENTS

JP    56-60061    5/1981

(Continued)

OTHER PUBLICATIONS

G. Scott, et al., IEEE, 2 pages, "NMOS Drive Current Reduction Caused by Transistor Layout and Trench Isolation Induced Stress," 1999.

(Continued)

*Primary Examiner*—Michael Lebentritt
*Assistant Examiner*—Angel Roman
(74) *Attorney, Agent, or Firm*—Oblon, Spivak, McClelland, Maier & Neustadt, P.C.

(57) ABSTRACT

A semiconductor wafer and its manufacturing method are provided where the current driving capability of a MOS transistor can be sufficiently enhanced. An SOI layer wafer in which an SOI layer (32) is formed has a <100> crystal direction notch (32*a*) and a <110> crystal direction notch (32*b*). The SOI layer wafer and a supporting substrate wafer (1) are bonded to each other in such a way that the notch (32*a*) and a <110> crystal direction notch (1*a*) of the supporting substrate wafer (1) coincide with each other. When bonding the two wafers by using the notch (32*a*) and the notch (1*a*) to position the two wafers, the other notch (32*b*) of the SOI layer wafer can be engaged with a guide member of the semiconductor wafer manufacturing apparatus to prevent positioning error due to relative turn between the wafers. Thus an MOS transistor with a sufficiently improved current driving capability can be fabricated on the semiconductor wafer with the two wafers positioned in crystal directions shifted from each other.

4 Claims, 7 Drawing Sheets

U.S. PATENT DOCUMENTS

| | | | |
|---|---|---|---|
| 5,494,835 | A | 2/1996 | Brunel |
| 5,869,386 | A | 2/1999 | Hamajima et al. |
| 6,174,222 | B1 | 1/2001 | Sato et al. |
| 6,313,014 | B1 * | 11/2001 | Sakaguchi et al. ........... 438/475 |
| 6,830,962 | B1 * | 12/2004 | Guarini et al. ............... 438/149 |
| 7,084,046 | B2 * | 8/2006 | Mitani et al. ................ 438/459 |
| 7,141,457 | B2 * | 11/2006 | Ieong et al. ................. 438/149 |
| 2001/0038153 | A1 | 11/2001 | Sakaguchi |
| 2002/0022344 | A1 * | 2/2002 | Kang et al. .................. 438/459 |
| 2003/0038383 | A1 | 2/2003 | Sakaguchi |
| 2003/0094674 | A1 | 5/2003 | Ipposhi et al. |
| 2003/0175531 | A1 | 9/2003 | Fournel et al. |
| 2004/0171228 | A1 * | 9/2004 | Matsumura et al. ......... 438/407 |
| 2005/0116290 | A1 * | 6/2005 | de Souza et al. ............ 257/347 |
| 2006/0024931 | A1 * | 2/2006 | Chan et al. .................. 438/528 |

FOREIGN PATENT DOCUMENTS

| | | |
|---|---|---|
| JP | 1-241854 | 9/1989 |
| JP | 02-250329 | 10/1990 |
| JP | 5-090117 | 4/1993 |
| JP | 06-5569 | 1/1994 |
| JP | 8-213578 | 8/1996 |
| JP | 9-153603 | 6/1997 |
| JP | 09-223667 | 8/1997 |
| JP | 9-223667 | 8/1997 |
| JP | 9-246505 | 9/1997 |
| JP | 11-251206 | 9/1999 |
| JP | 2002-134374 | 5/2002 |
| KR | 2001-0070456 | 7/2001 |

OTHER PUBLICATIONS

M. Bruel, et al., "Smart Cut: A Promising New SOI Material Technology", Proceedings 1995 IEEE International SOI Conference, Oct. 1995, pp. 178-179.

N. Sato et al., "High-Quality Epitaxial Layer Transfer (ELTRAN) By Bond and Etch-Back of Porous Si"; Proceedings 1995 IEEE International SOI Conference, Oct. 1995, pp. 176-177.

K. Ohmi et al., "Water Jet Splitting of Thin Porous Si for ELTRAN", Extended Abstracts of the 1999 International Conference on Solid State Devices and Materials, Tokyo, 1999, pp. 354-355.

H. Sayama et al., "Effect of <100> Channel Direction for High Performance SCE Immune pMOSFET with Less Than 0.15 μm Gate Length", 1999 IEEE, IEDM, pp. 657-660.

H. Sayama et al., "Effect of <100> Channel Direction for High Performance SCE Immune pMOSFET with Less Than 0.15 μm Gate Length", Dec. 5, 1999, Electron Devices Meeting, 1999 IEDM Technical Digest, International Washington, DC, USA, pp. 657-660.

T. Matsumoto, et al. "Novel SOI Wafer Engineering using low stress and high mobility CMOSFET with <100> Channel for Embedded RF/Analog Applications" International Electron Devices Meeting 2002, IEDM, Technical Digest, San Francisco, CA, Dec. 8, 2002, pp. 663-666.

* cited by examiner

SEMICONDUCTOR WAFER AND MANUFACTURING METHOD THEREOF

CROSS-REFERENCE TO RELATED APPLICATIONS

This application is a divisional application of, and claims priority to, U.S. Pat. application Ser. No. 10/461,352 filed Jun. 16, 2003 now abandoned and claims priority to Japanese Patent Application 2002-285160 filed Sep. 30, 2002.

BACKGROUND OF THE INVENTION

1. Field of the Invention

The present invention relates to a semiconductor wafer and a manufacturing method thereof.

2. Description of the Background Art

In a conventional SOI (Silicon On Insulator or Semiconductor On Insulator) wafer, an oxide film layer resides on one main surface of a supporting substrate wafer made of, e.g. a silicon substrate, and an SOI layer resides on the top surface of the oxide film layer. Such SOI and oxide film layers are formed by bonding to the supporting substrate wafer an SOI layer wafer that has a silicon substrate with an oxide film formed on its main surface and then removing part of it.

After the supporting substrate wafer and the SOI layer wafer are bonded together, an unwanted portion of the SOI layer wafer is removed by adopting a method such as SMART CUT(Registered Trademark) or ELTRAN(Registered Trademark); refer to Patent Document 1 shown below.

When a MOS (Metal Oxide Semiconductor) transistor is formed in the SOI layer, it is arranged so that its channel direction is parallel to a <100> crystal direction of the SOI layer, for example. It is known that arranging the channel direction in parallel with <100> crystal direction enhances the current driving capability of the P-channel MOS transistor by about 15 percent and also reduces the short-channel effect.

It is thought that the current driving capability is enhanced because the hole mobility in <100> crystal direction is larger than that in <110> crystal direction, and that the short-channel effect is reduced because the value of the boron diffusion coefficient in <100> crystal direction is smaller than that in <110> crystal direction.

Now, with SOI wafers, the SOI layer wafer, in which SOI and oxide film layers are formed, may be bonded to the supporting substrate wafer with their crystal directions shifted at 45° (or 135°) with respect to each other. Specifically, the two wafers are bonded together in such a way that a <100> crystal direction of the SOI layer and a <110> crystal direction of the supporting substrate wafer coincide with each other. The reason is shown below.

(100) wafers cleave along {110} crystal planes. Accordingly, when the SOI layer wafer and the supporting substrate wafer are bonded together so that the <100> crystal direction of the former coincides with the <110> crystal direction of the latter, the wafer can be cleaved, for experiments and studies, along {110} cleavage planes of the supporting substrate wafer 1 that forms a large part of the wafer thickness. On the other hand, in the SOI layer whose crystal direction is shifted, an MOS transistor can be formed so that its channel direction is parallel with a <100> crystal direction.

Thus, when cleaved, the supporting substrate wafer 1 breaks along <110> crystal direction, while the SOI layer breaks along <100> crystal direction. In this way, bonding the two wafers with their crystal directions shifted from each other provides the advantage that a section along the MOS transistor channel direction can be easily exposed.

The following list shows prior art reference information related to the present invention:

Patent Document 1: Japanese Patent Application Laid-Open No. 2002-134374,

Patent Document 2: Japanese Patent Application Laid-Open No. 9-153603 (1997), and Non-Patent Publication 1: G. Scott et al., "NMOS Drive Current Reduction Caused by Transistor Layout and Trench Isolation Induced Stress," (US), IEDM, 1999.

A conventional SOI wafer is manufactured by a method shown below, for example.

First, an SOI layer wafer and a supporting substrate wafer are prepared, both of which are a (100) wafer having a (100) plane as a main surface. Next, a notch (or an orientation flat) is formed at a <100> crystal direction edge of the SOI layer wafer and a notch (or an orientation flat) is formed at a <110> crystal direction edge of the supporting substrate wafer. Then, the two substrates are bonded together in such a way that the <100> crystal direction of the SOI layer and the <110> crystal direction of the supporting substrate wafer coincide with each other.

In this bonding process, the two wafers are bonded so that the notch of the supporting substrate wafer and the notch of the SOI layer wafer coincide with each other. However, when the two wafers are positioned by utilizing these notches only, the SOI layer <100> crystal direction and the supporting substrate wafer <110> crystal direction may not be precisely aligned.

With such a positioning error between wafers, the MOS transistor channel direction cannot be precisely aligned with the SOI layer <100> crystal direction and a deviation is caused between the two. This is because MOS transistors are formed on the basis of the position of the supporting substrate wafer.

Then the current driving capability of the MOS transistors cannot be enhanced satisfactorily. Furthermore, electric characteristic variations will occur among MOS transistors formed on the surfaces of different SOI wafers.

SUMMARY OF THE INVENTION

Accordingly, an object of the present invention is to provide a semiconductor wafer and a manufacturing method thereof in which the current driving capability of a MOS transistor can be sufficiently enhanced.

According to a first aspect of the present invention, a semiconductor wafer includes a first semiconductor wafer and a second semiconductor wafer.

The first semiconductor wafer has a plurality of cuts formed at edge portions in crystal directions, and the second semiconductor wafer has a cut formed at an edge portion in a crystal direction.

One of the plurality of cuts of the first semiconductor wafer and the cut of the second semiconductor wafer are formed in different crystal directions. The first and second semiconductor wafers are bonded to each other with said one of the plurality of cuts of the first semiconductor wafer and the cut of the second semiconductor wafer coinciding with each other.

The first semiconductor wafer has a plurality of cuts and the first and second semiconductor wafers are bonded together in such a way that one of the plurality of cuts of the first semiconductor wafer and the cut of the second semiconductor wafer coincide with each other. That one of the plurality of cuts of the first semiconductor wafer and the cut of the second semiconductor wafer are positioned in different crystal directions. Thus, when the two wafers are bonded together using the coinciding cuts for positioning, another cut of the first semiconductor wafer can be engaged with a guide portion of the semiconductor wafer manufacturing apparatus to prevent positioning error due to relative turn between the wafers. This allows the two wafers to be highly precisely positioned. Thus the semiconductor wafer can be easily cleaved so that a section along MOS transistor channel direction is exposed, and a MOS transistor having a remarkably enhanced current driving capability can be formed on the semiconductor wafer.

According to a second aspect of the present invention, a semiconductor wafer manufacturing method includes the following steps (a) to (d). In the step (a), first and second semiconductor wafers are prepared. In the step (b), a main surface of the second semiconductor wafer is bonded to a main surface of the first semiconductor wafer. In the step (c), oxygen ions are implanted from the first semiconductor wafer side into a neighborhood of a part where the first and second semiconductor wafer are bonded to each other. In the step (d), the portion implanted with the oxygen ions is formed into an oxide film layer by a thermal treatment.

After the first and second semiconductor wafers are bonded together, oxygen ions are implanted and the oxygen-ion-implanted portion is processed into an oxide film layer through a thermal treatment. Thus, by bonding together the first and second semiconductor wafers in crystal directions shifted from each other, it is possible to form an SOI wafer that includes an SOI layer and a supporting substrate having crystal directions shifted with respect to each other. Furthermore, forming the oxide film layer by oxygen ion implantation and thermal process provides an SOI wafer with reduced SOI layer thickness nonuniformity. The reduced SOI layer thickness nonuniformity enhances the current driving capability. Thus the semiconductor wafer can be easily cleaved so that a section along the MOS transistor channel direction is exposed, and an MOS transistor having a remarkably enhanced current driving capability can be formed on the semiconductor wafer.

According to a third aspect of the present invention, a semiconductor wafer manufacturing method includes the steps (a) to (e). In the step (a), a first semiconductor wafer having a plurality of cuts formed at edge portions in crystal directions is prepared. In the step (b), a second semiconductor wafer having a cut formed at an edge portion in a crystal direction that is different from the crystal direction of one of the plurality of cuts of the first semiconductor wafer is prepared. In the step (c), the first and second semiconductor wafers are bonded to each other while using said one of the plurality of cuts of the first semiconductor wafer and the cut of the second semiconductor wafer in order to position the first and second semiconductor wafers, with another one of the plurality of cuts of the first semiconductor wafer being engaged with a guide portion of a semiconductor wafer manufacturing apparatus. In the step (d), oxygen ions are implanted from the first semiconductor wafer side into a neighborhood of a part where the first and second semiconductor wafers are bonded to each other. In the step (e), the portion implanted with the oxygen ions is formed into an oxide film layer by a thermal treatment.

After the first and second semiconductor wafers are bonded together, oxygen ions are implanted and the oxygen-ion-implanted portion is processed into an oxide film layer through a thermal treatment. Accordingly, by bonding together the first and second semiconductor wafers in crystal directions shifted from each other, it is possible to form an SOI wafer that includes an SOI layer and a supporting substrate having crystal directions shifted with respect to each other. Furthermore, forming the oxide film layer by oxygen ion implantation and thermal process provides an SOI wafer with reduced SOI layer thickness nonuniformity. The reduced SOI layer thickness nonuniformity enhances the current driving capability. Thus the semiconductor wafer can be easily cleaved so that a section along MOS transistor channel direction is exposed, and a MOS transistor having a remarkably enhanced current driving capability can be formed on the semiconductor wafer. Moreover, in the step (c), the first and second semiconductor wafers are bonded together with another one of the plurality of cuts of the first semiconductor wafer engaged with a guide portion of the semiconductor wafer manufacturing apparatus. This prevents positioning error due to relative turn between the wafers. Thus the two wafers can be highly precisely positioned and a MOS transistor with a sufficiently enhanced current driving capability can be formed on the semiconductor wafer with the two wafers bonded in different crystal directions with respect to each other. Furthermore, electric characteristic variations are less likely to occur among MOS transistors formed on different semiconductor wafers.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
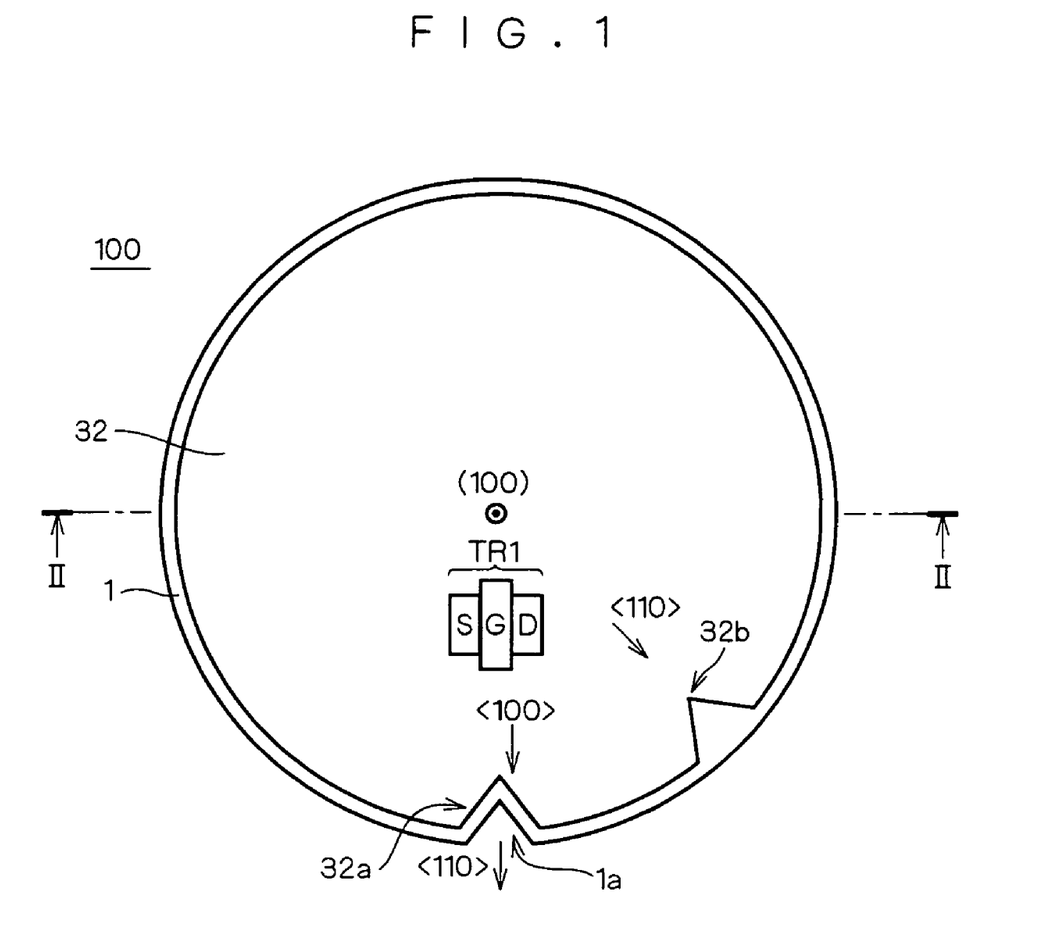
FIG. 1 is the top view of a semiconductor wafer according to a first preferred embodiment.
Figure 2:
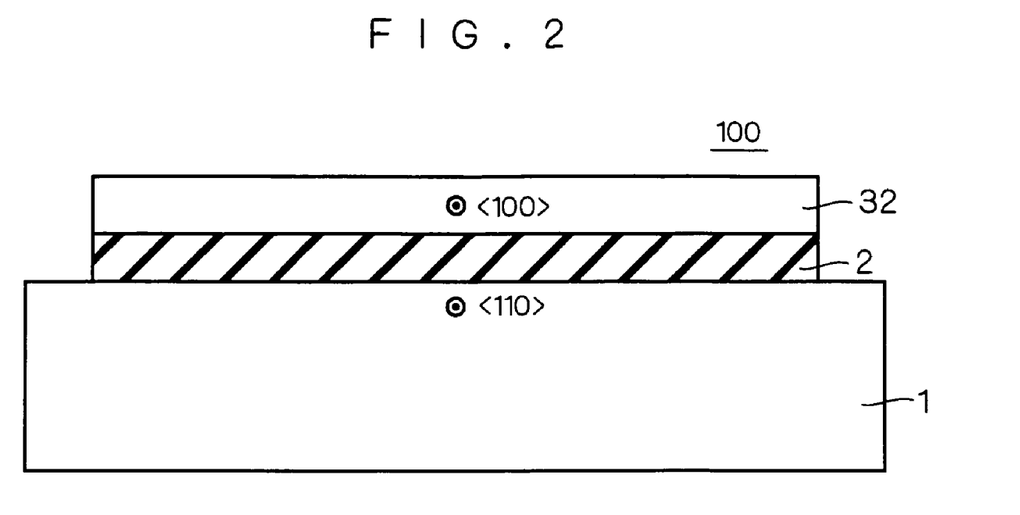
FIG. 2 is a cross-sectional view of the semiconductor wafer of the first preferred embodiment.

FIG. 1 is the top view of a semiconductor wafer according to this preferred embodiment. This semiconductor wafer 100 is a (100) wafer that has a (100) plane as its main surface (in FIG. 1, the circle containing a point inside represents an arrow that shows the normal direction to the (100) plane. FIG. 2 shows the II—II section of FIG. 1.

The SOI wafer 100 includes a supporting substrate wafer 1 formed of, e.g. a silicon substrate, an oxide film layer 2 resides on one main surface of the supporting substrate wafer 1, and an SOI layer 32 resides on top of the oxide film layer 2. This SOI layer 32 and the oxide film layer 2 are formed by bonding to the supporting substrate wafer 1 an SOI layer wafer that has a silicon substrate and an oxide film formed on its main surface and then removing part of it. While the SOI layer 32 and oxide film layer 2 and the supporting substrate wafer 1 generally have approximately the same diameter, their diameters may be somewhat different from each other depending on the manufacturing process.

Semiconductor devices, including MOS transistors and interconnections among them, are formed in the surface of the SOI layer 32. The MOS transistor TR1 of FIG. 1 is an example of such a semiconductor device. In the MOS transistor TR1, "S" denotes its source, "D" denotes its drain, and "G" denotes its gate.

This MOS transistor TR1 is arranged so that its channel direction is parallel with a <100> crystal direction of the SOI layer 32.

In the semiconductor wafer 100, the supporting substrate wafer 1 has a notch 1a formed at an edge portion in a <110> crystal direction and the SOI layer 32 has a <100> crystal direction notch 32a and a <110> crystal direction notch 32b.

The bonding of the supporting substrate wafer and the SOI layer wafer is now described, where a SMART CUT method is shown by way of example.

Figure 3:
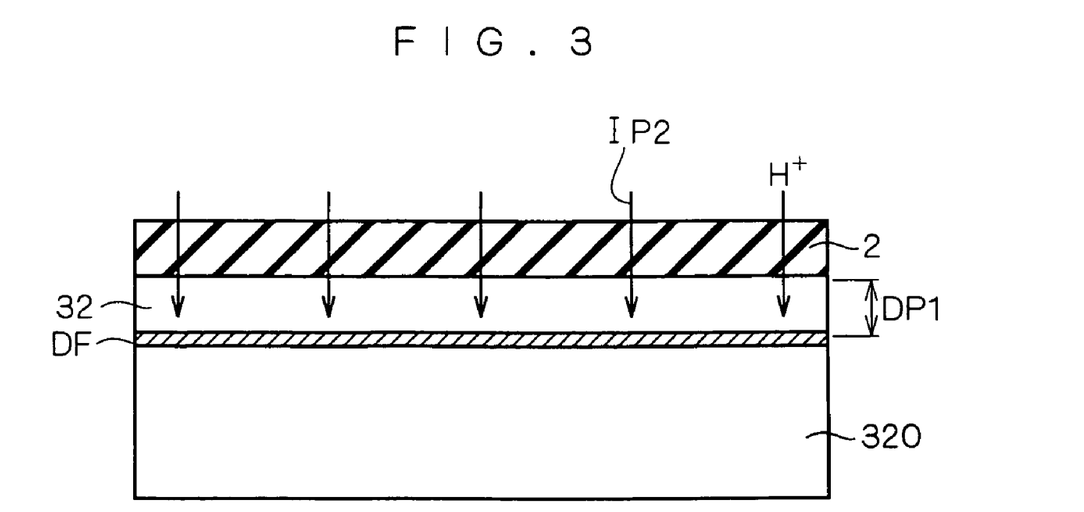
FIGS. 3 to 5 are cross-sectional views showing a bonding process for forming the semiconductor wafer of the first preferred embodiment.

Before bonding, the oxide film layer 2 is formed on a surface of an SOI layer wafer 320 and a crystal defect layer DF is formed by a hydrogen ion implantation IP2 in a portion deeper than the oxide film layer 2 by the thickness DP1 of the SOI layer 32 (see FIG. 3).

Figure 4:
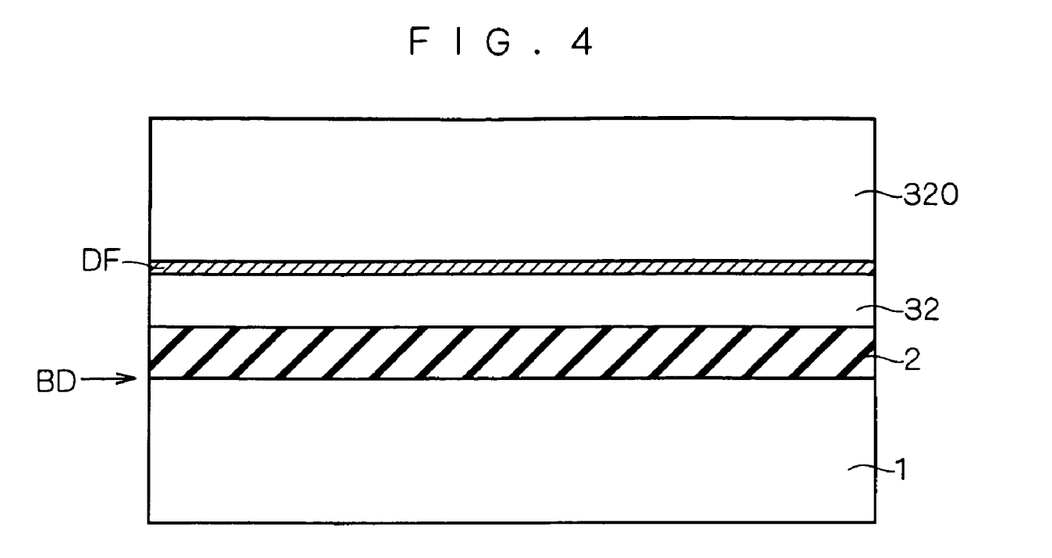

Next, as shown in FIG. 4, the oxide film layer 2 of the SOI layer wafer 320 is bonded to a main surface of the supporting substrate wafer 1. In FIG. 4, the position of the bonded plane is shown as BD. Note that the supporting substrate wafer 1 and the SOI layer wafer 320 are bonded so that their <100> crystal directions are at an angle of 45° or 135° with respect to each other.

Figure 5:
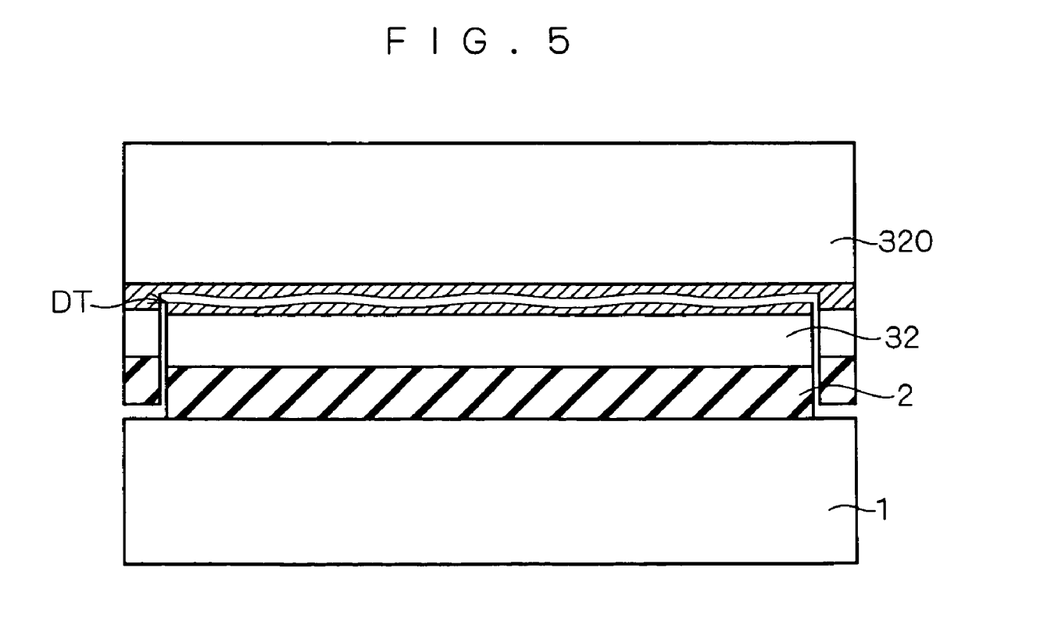

Next, a thermal treatment is applied to weaken the crystal defect layer DF and the SOI layer wafer 320 is separated at the crystal defect layer DF as shown in FIG. 5. At this time, the peripheral portions of the SOI layer wafer 320, which are not bonded firmly, are also removed. FIG. 5 shows the dividing plane as DT.

Then the structure is further heat-treated to increase the bonding strength between the SOI layer 32 and the supporting substrate wafer 1, and the surface of the SOI layer 32 is lightly polished to remove the residue of the crystal defect layer. The semiconductor wafer 100 shown in FIGS. 1 and 2 are obtained in this way.

Figure 6:
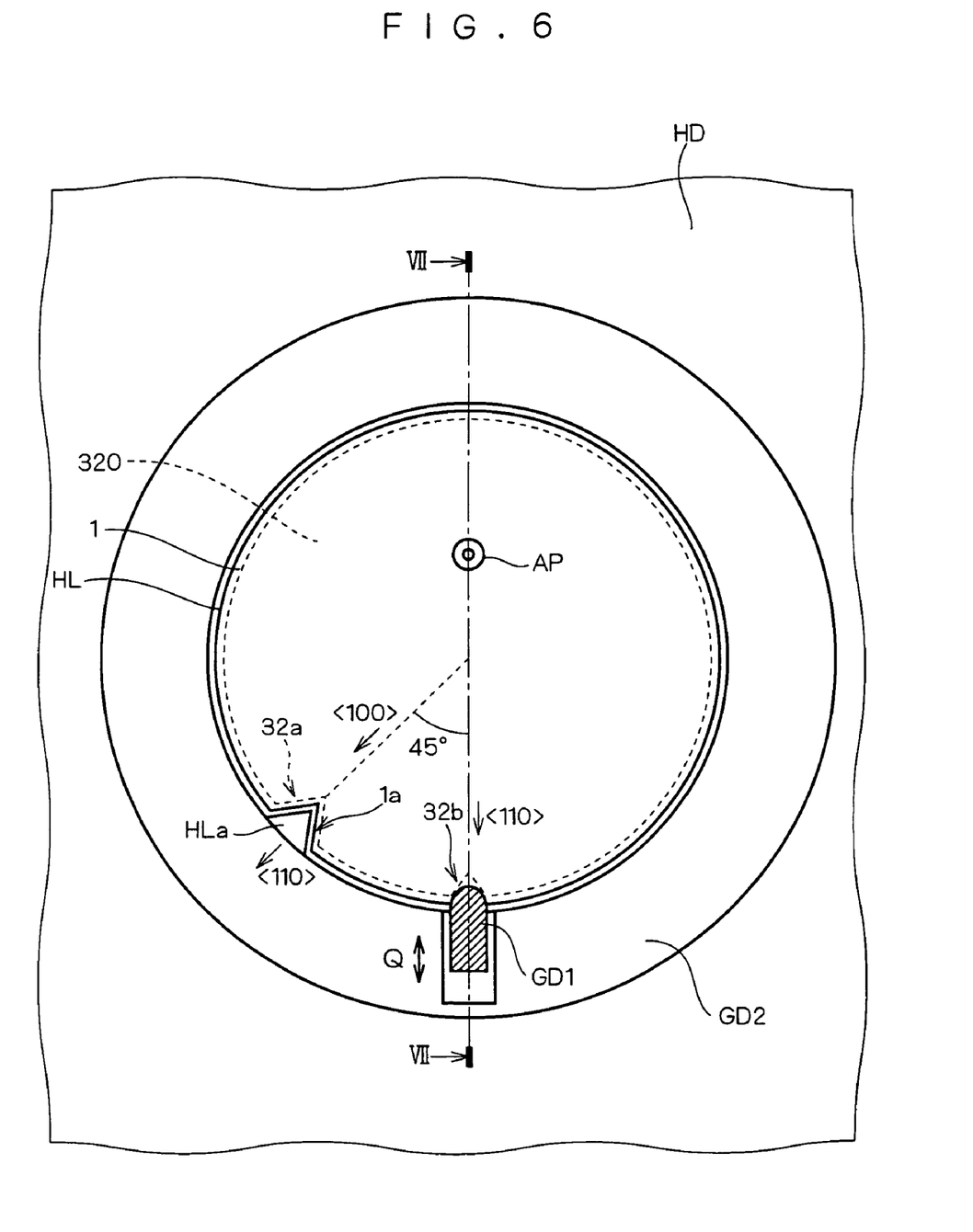
FIG. 6 is the top view of a semiconductor wafer manufacturing apparatus that is used in the semiconductor wafer bonding process of the first preferred embodiment.
Figure 7:
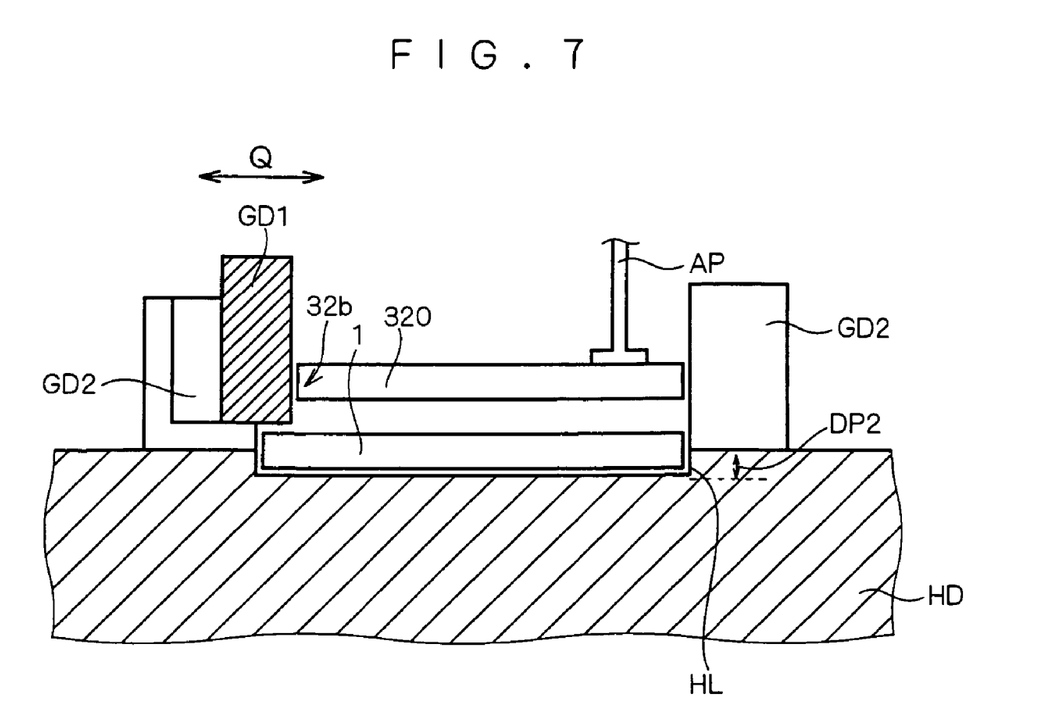
FIG. 7 is a cross-sectional view of the semiconductor wafer manufacturing apparatus used in the semiconductor wafer bonding process of the first preferred embodiment.

Next, the process of bonding the supporting substrate wafer 1 and the SOI layer wafer 320 is described in greater detail. The bonding process is performed by using a semiconductor wafer manufacturing apparatus as shown in FIGS. 6 and 7, for example. FIG. 7 shows the VII—VII section of FIG. 6.

This manufacturing apparatus includes a holder HD for holding the supporting substrate wafer 1, a wafer guide GD2 used as a guide for positioning the SOI layer wafer 320 to be bonded, and an air pin AP for sucking and holding the semiconductor wafer. FIG. 6 shows the SOI layer wafer 320 with broken line and clearly depicts the supporting substrate wafer 1 underneath.

The holder HD has a recess HL having a depth DP2, where the supporting substrate wafer 1 is placed. A raised portion HLa is formed at the edge of the recess HL; the supporting substrate wafer 1 is placed there with the raised portion HLa engaged with or fitted in the notch 1a.

The wafer guide GD2 is a guiding member that is situated on the holder HD to surround the recess HL. The raised portion HLa is extended also on the wafer guide GD2 so that it can be engaged also with the notch 32a of the SOI layer wafer 320.

The wafer guide GD2 includes another raised portion GD1 that can be moved back and forth along the arrow Q shown in the drawings. The raised portion GD1 can be moved to protrude from the wafer guide GD2 toward the SOI layer wafer 320, so that it can be engaged with the <110> direction notch 32b of the SOI layer wafer 320. The raised portion GD1 and the raised portion HLa are positioned on the wafer guide GD2 at an angle of 45° with respect to each other. The raised portion GD1 is situated at a level higher than the supporting substrate wafer 1 placed in the recess HL so that it will not touch the supporting substrate wafer 1 when it is moved.

When this manufacturing apparatus is used, the raised portion GD1 is set in the withdrawn position in the wafer guide GD2, the supporting substrate wafer 1 is placed in the recess HL of the holder HD, and then the raised portion GD1 is moved to protrude from the wafer guide GD2. Next the SOI layer wafer 320 is carried with the air pin AP and moved down onto the supporting substrate wafer 1 so that the notch 32a and the notch 32b are engaged respectively with the raised portions HLa and GD1, and then the SOI layer wafer 320 and the supporting substrate wafer 1 are bonded together. Subsequently, the raised portion GD1 is withdrawn into the wafer guide GD2 and the bonded wafers 1 and 320 are pulled up and taken out with the air pin AP.

When the depth DP2 of the recess HL is sized smaller than the thickness of the supporting substrate wafer 1, the supporting substrate wafer 1 placed in the recess HL slightly protrudes above the surface of the holder HD. In this case, when the raised portion GD1 is moved to protrude from the wafer guide GD2, the bottom of the raised portion GD1 and the surface of the supporting substrate wafer 1 are not excessively spaced apart, and then the SOI layer wafer 320 can be put down while ensuring the engagement between the notch 32b and the raised portion GD1.

During this process of bonding the two wafers, they are positioned so that the notch 1a of the supporting substrate wafer 1 and the notch 32a of the SOI layer wafer 320 coincide with each other, while the notch 32b of the SOI layer wafer 320 is engaged with the raised portion GD1 that serves as a guide member of the semiconductor wafer manufacturing apparatus.

Note that "the notch 1a and the notch 32a coincide with each other" does not mean that their shapes perfectly coincide with each other. For example, the depths of the two notches 1a and 32a in the wafer radius direction may somewhat differ from each other. Also, the central angles of the two notches 1a and 32a, i.e. the angle between the two sides of each "fan" shape, may somewhat differ from each other. The notch 1a and notch 32a work as long as their shapes coincide with each other to such an extent that the positioning can be achieved precisely.

Thus, the raised portion GD1 engaged with the notch 32b limits the turning movement of the SOI layer wafer 320 in the wafer plane direction, which makes it possible to more effectively prevent positioning error due to relative turn between the wafers, than in conventional bonding process where wafers are positioned using only the notches 1a and 32a. Thus the wafers can be highly precisely positioned, so that an MOS transistor TR1 having a sufficiently enhanced current driving capability can be formed on the semiconductor wafer, with the two wafers positioned in crystal directions shifted from each other. Furthermore, electric characteristic variations are less likely to occur among MOS transistors TR1 formed on different semiconductor wafers.

Note that the rest of the semiconductor wafer 100 manufacturing process, other than the bonding process, may be conducted by adopting other method, such as an ELTRAN method, as well as the SMART CUT method.

Figure 8:
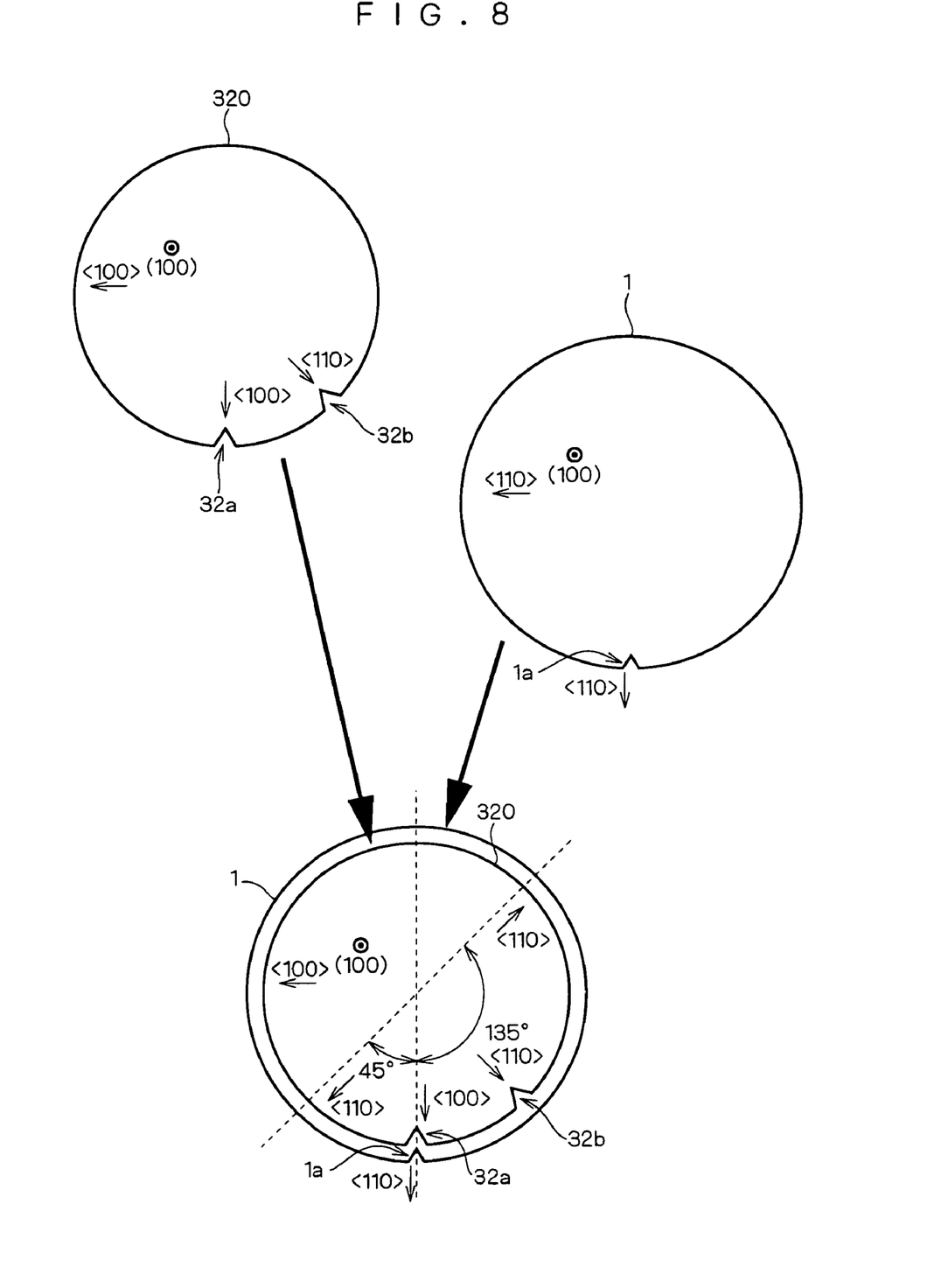
FIG. 8 is a diagram depicting the semiconductor wafer bonding process of the first preferred embodiment.

This preferred embodiment thus provides a semiconductor wafer and a manufacturing method thereof in which the <100> crystal direction notch 32a and the <110> crystal direction notch 32b are formed in the SOI layer wafer 320 and the two wafers 1 and 320 are bonded together with the <100> crystal direction notch 32a and the <110> crystal direction notch 1a of the supporting substrate wafer 1 coinciding with each other (see FIG. 8).

As shown above, the SOI layer wafer 320 has the notches 32a and 32b. Accordingly, while the supporting substrate wafer 1 and the SOI layer wafer 320 are positioned by utilizing the notch 1a of the wafer 1 and the notch 32a of the wafer 320, the notch 32b of the SOI layer wafer 320 can be engaged with a guide member of the semiconductor wafer manufacturing apparatus to prevent positioning error between the wafers that would be caused if the wafers turn relative to each other. This allows the two wafers 1 and 320 to be precisely positioned. As a result, it is easy to cleave the semiconductor wafer to expose a section along the MOS transistor channel direction, and it is possible to form an MOS transistor with a sufficiently enhanced current driving capability on the semiconductor wafer.

While this preferred embodiment has shown an example in which the SOI layer wafer 320 and the supporting substrate wafer 1 are bonded together to form an SOI wafer, the present invention is not limited by this example. That is to say, the present invention can be applied also to bulk wafers that have no oxide film layer 2. That is, the present invention can be applied to the formation of a bulk wafer in which two bulk wafers are bonded together with their crystal directions shifted from each other, so as to form a bulk wafer whose surface crystal direction differs from that in the deeper portion.

Also, while this preferred embodiment has shown an example in which notches are used to indicate crystal directions, any cuts of other shapes, such as orientation flats, may be used to show the crystal directions.

Moreover, while this preferred embodiment has shown an example in which the notches 32a and 32b are formed in the SOI layer wafer 320 respectively in <100> and <110> crystal directions, the invention is not limited by this example. Notches 32a and 32b may be formed in directions other than <100> and <110> crystal directions, and they may be positioned in other relationship with respect to each other.

Second Preferred Embodiment

This preferred embodiment shows a method suited to manufacture SOI wafers in which, as shown with the semiconductor wafer 100 of FIG. 1, an SOI layer and a supporting substrate wafer are bonded in crystal directions shifted from each other.

Figure 9:
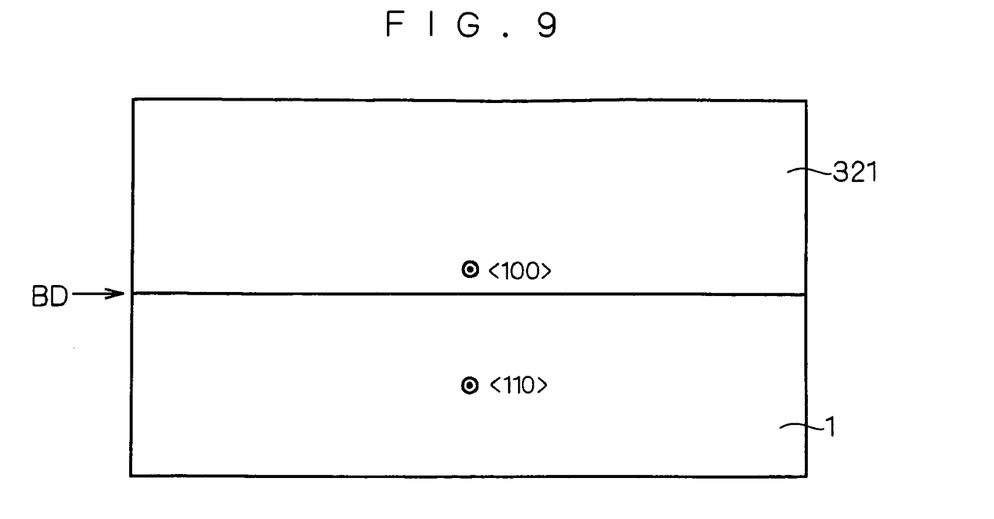
FIGS. 9 to 11 are cross-sectional views showing a semiconductor wafer manufacturing method according to a second preferred embodiment.
Figure 10:
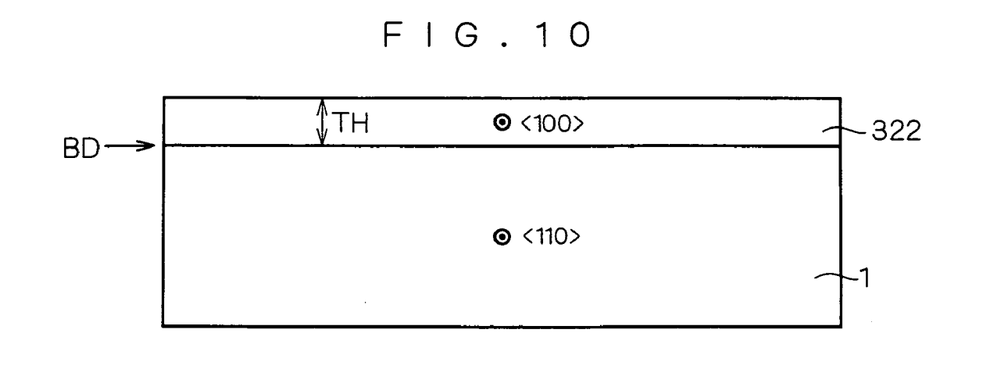
Figure 11:
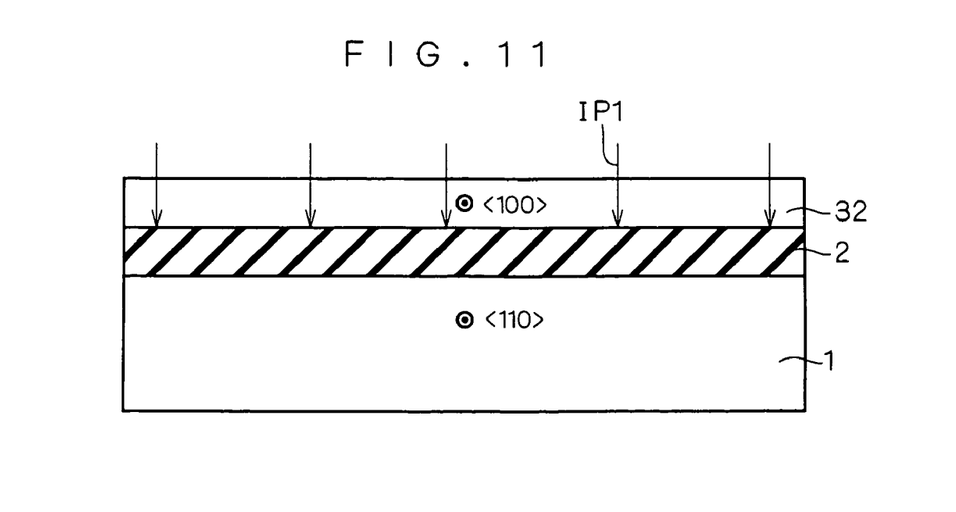

FIGS. 9 to 11 are cross-sectional views showing a semiconductor wafer manufacturing method according to this preferred embodiment.

First, an SOI layer wafer 321 and a supporting substrate wafer 1, both of which are a semiconductor wafer that has a (100) plane as a main surface, are prepared and bonded together in such a way that a <100> crystal direction of the SOI layer wafer 321 and a <110> crystal direction of the supporting substrate wafer 1 coincide with each other (see FIG. 9). FIG. 9 shows the position of the bonded plane as BD. At this stage, no oxide film layer exists on the SOI layer wafer 321 and the supporting substrate wafer 1.

Preferably, in this bonding process, a plurality of notches are formed on the edge of the SOI layer wafer 321 as has been shown in the first preferred embodiment and the two wafers are precisely positioned by using the semiconductor wafer manufacturing apparatus shown in FIGS. 6 and 7. However, this preferred embodiment is not limited to this example.

Next, the surface of the SOI layer wafer 321 is processed by grinding, CMP (Chemical Mechanical Polishing), chemical treatment or the like, so as to thin the SOI layer wafer 321 to form a semiconductor layer 322 (see FIG. 10). The thickness TH of the semiconductor layer 322 may be about 100 to 1000 nm, for example.

Next, an oxygen ion implantation IP1 is applied from the semiconductor layer 322 side into the portion where the two wafers are bonded to each other (into a neighborhood of the bonded plane BD). Then the structure is thermally processed at a temperature of about 1300° C. to 1400° C. to form the oxygen-ion-implanted portion into an oxide film layer 2. Thus the portion of the semiconductor layer 322 that is left unoxidized forms the SOI layer 32 (see FIG. 11). The dosage of oxygen ions can be $1 \times 10^{17}$ to $1 \times 10^{18}$ cm$^{-2}$, for example.

According to this preferred embodiment, the SOI layer wafer 321 and the supporting substrate wafer 1 are bonded together with their crystal directions shifted from each other, implanted with oxygen ions, and thermally processed to form the oxygen-ion-implanted portion into the oxide film layer 2.

In general bonding methods, an oxide film layer is formed on a surface of one wafer and then this wafer is bonded to another wafer, without the need for oxygen ion implantation. However, nonuniformity of the film thickness of the SOI layer can be easily prevented by precisely controlling the oxygen ion implantation, so as to form a thin film with uniform thickness.

Thus, this preferred embodiment enables the manufacture of an SOI wafer that has the SOI layer 32 with reduced film thickness nonuniformity. The reduced thickness nonuniformity of the SOI layer enhances the current driving capability. In this way, the semiconductor wafer can be easily cleaved so that a section along MOS transistor channel direction is exposed, and a MOS transistor having a remarkably enhanced current driving capability can be formed on the semiconductor wafer.

While the invention has been described in detail, the foregoing description is in all aspects illustrative and not restrictive. It is understood that numerous other modifications and variations can be devised without departing from the scope of the invention.

What is claimed is:

1. A semiconductor wafer manufacturing method comprising the steps of:
   (a) preparing first and second semiconductor wafers;
   (b) bonding a main surface of said second semiconductor wafer to a main surface of said first semiconductor wafer;
   (c) implanting oxygen ions from said first semiconductor wafer side into a neighborhood of a part where said first and second semiconductor wafers are bonded to each other; and
   (d) forming the portion implanted with the oxygen ions into an oxide film layer by a thermal treatment.

2. The semiconductor wafer manufacturing method according to claim 1, wherein crystal directions of said first and second semiconductor wafers are shifted 45° or 135° with respect to each other.

3. A semiconductor wafer manufacturing method comprising the steps of:
(a) preparing a first semiconductor wafer having a plurality of cuts formed at edge portions in crystal directions;
(b) preparing a second semiconductor wafer having a cut formed at an edge portion in a crystal direction that is different from the crystal direction of one of said plurality of cuts of said first semiconductor wafer;
(c) bonding said first and second semiconductor wafers to each other while using said one of said plurality of cuts of said first semiconductor wafer and said cut of said second semiconductor wafer in order to position said first and second semiconductor wafers, with another one of said plurality of cuts of said first semiconductor wafer being engaged with a guide portion of a semiconductor wafer manufacturing apparatus;
(d) implanting oxygen ions from said first semiconductor wafer side into a neighborhood of a part where said first and second semiconductor wafers are bonded to each other; and
(e) forming the portion implanted with the oxygen ions into an oxide film layer by a thermal treatment.

4. The semiconductor wafer manufacturing method according to claim 3, wherein said one of said cuts of said first semiconductor wafer and said cut of said second semiconductor wafer are formed at positions shifted 45° or 135° with respect to each other.

* * * * *